United States Patent [19]
DeStefano et al.

[11] Patent Number: 6,089,285
[45] Date of Patent: Jul. 18, 2000

[54] METHOD AND SYSTEM FOR SUPPLYING SEMICONDUCTOR SOURCE MATERIAL

[75] Inventors: Mark DeStefano, Chesterfield; James Dean Eoff, Sr., New Florence; Thomas H. Schulte, St. Peters; John M. Anderson, O'Fallon; Eng Chin Yau, St. Charles; Donald R. Ruggeri, Chesterfield; David W. Baldwin, St. Peters; Charles Lawrence Badino, Chesterfield, all of Mo.

[73] Assignee: MEMC Electronics Materials, Inc., St. Peters, Mo.

[21] Appl. No.: 09/069,417

[22] Filed: Apr. 29, 1998

[51] Int. Cl.[7] .......................................... B65B 1/04
[52] U.S. Cl. ................. 141/231; 141/1; 141/82; 141/129; 222/1; 222/146.2; 222/152; 222/160; 222/608; 222/611.1
[58] Field of Search .................... 222/1, 146.2, 146.5, 222/152, 160, 167, 168, 608, 611.1, 626; 141/1, 63, 82, 89, 91, 129, 231

[56] References Cited

U.S. PATENT DOCUMENTS

| | | | |
|---|---|---|---|
| 5,141,387 | 8/1992 | Smith | 414/735 |
| 5,474,111 | 12/1995 | Williamson et al. | 141/1 |
| 5,855,232 | 1/1999 | Oda et al. | 141/83 |
| 5,950,693 | 9/1999 | Noah et al. | 141/231 |

FOREIGN PATENT DOCUMENTS

| | | | |
|---|---|---|---|
| 0 314 858 A1 | 5/1989 | European Pat. Off. | C30B 15/02 |
| 0 771 891 A1 | 5/1997 | European Pat. Off. | C30B 15/02 |
| 59-115736 | 7/1984 | Japan | B01J 4/00 |
| 03023286 | 1/1991 | Japan | C30B 15/02 |
| 03290392 | 12/1991 | Japan | C30B 15/02 |
| 04042900 | 2/1992 | Japan | C30B 35/00 |
| 10025188 | 1/1998 | Japan | C30B 15/10 |
| WO 91/05723 | 5/1991 | WIPO | B65G 53/04 |
| 0 537 988 A1 | 4/1993 | WIPO | C30B 15/02 |

OTHER PUBLICATIONS

International Search Report, PCT/US99/04697, dated Jun. 11, 1999, pp. 1–3.

*Primary Examiner*—J. Casimer Jacyna
*Attorney, Agent, or Firm*—Senniger, Powers, Leavitt & Roedel

[57] ABSTRACT

A method of supplying source material in a crystal puller used to grow single crystal semiconductor material. Generally, the method includes receiving a bulk container of the source material at a facility having the crystal puller and configuring the bulk container for gravity feed of the source material from the container. The bulk container is transported to the crystal puller and a predetermined quantity of source material is dispensed directly from the bulk container into the crystal puller. Apparatus and a system for use in supplying source material are also disclosed.

23 Claims, 7 Drawing Sheets

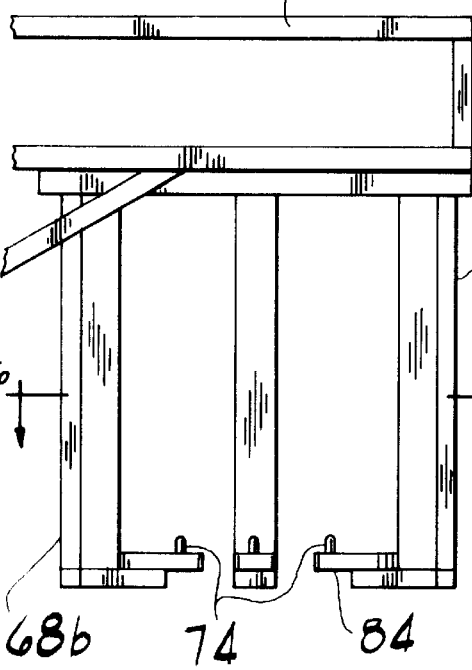
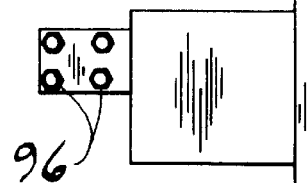
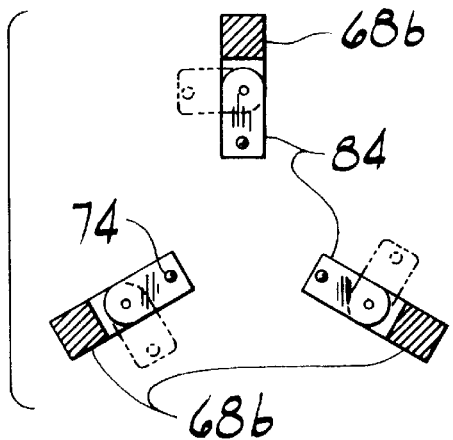
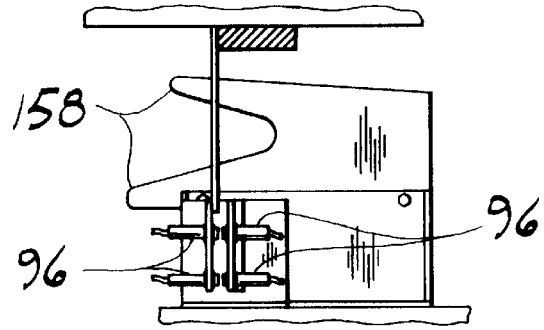

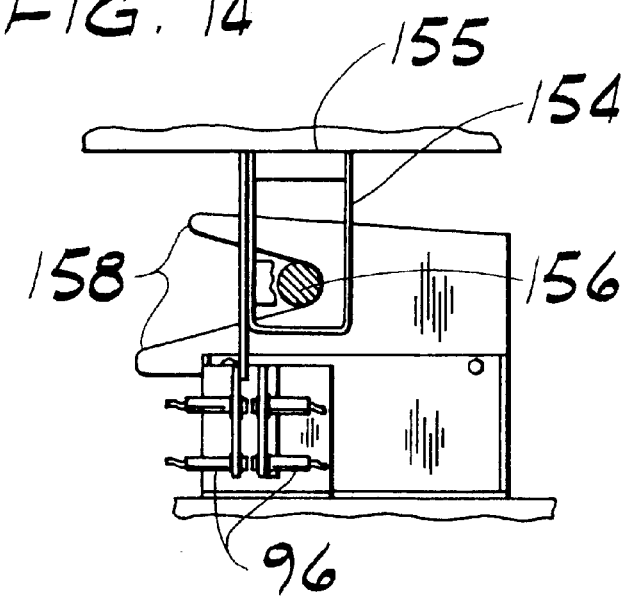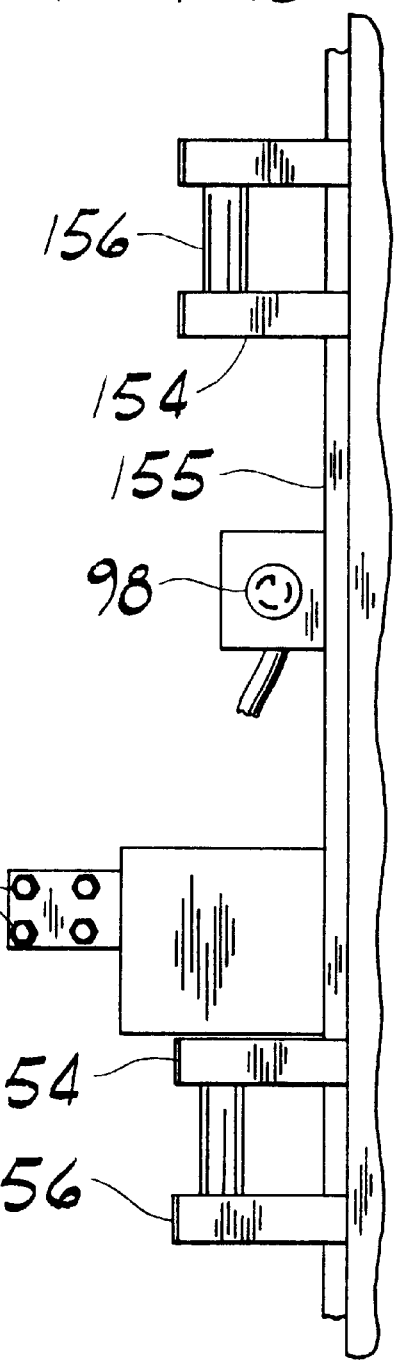

METHOD AND SYSTEM FOR SUPPLYING SEMICONDUCTOR SOURCE MATERIAL

BACKGROUND OF THE INVENTION

The present invention relates generally to methods and devices for handling semiconductor source material and more particularly to a method and apparatus for configuring and transporting a bulk container of source material.

The most common production technique for making semiconductor material is the Czochralski method in which high purity source material is melted down in a crucible within a crystal puller to form a melt. It is often desirable not to place all of the solid source material needed to form the melt in the crucible at one time. Some solid source material is preferably introduced to the crucible after melting has already commenced. Typically, the additional solid source material is pelletized polysilicon (often referred to in the industry as "Lite Poly") which is fed from a hopper connected to the crystal puller. The hopper may be occasionally supplied with source material which is received at the crystal puller facility in bulk containers. Supplying the hopper with source material is difficult for several reasons. The bulk containers are very heavy (approximately 275 kilograms), so that the containers are not easily transported nor easily inverted for gravity feed of the source material. Dispensing the source material from the container produces dust which is undesirable because the dust is easily contaminated. Further, if the dust is transferred to the melt, it can cause voids in the semiconductor material. Preferably, the dust is not introduced to the hopper. Moreover, exposure of the source material to the environment should be limited because of the risk of contaminating the source material. Presently, the hopper is supplied by decanting the source material from the bulk container into smaller containers, then transferring the smaller containers to the crystal puller and pouring the source material into the hopper. Often this procedure introduces dust into the hopper and exposes the source material to the environment.

SUMMARY OF THE INVENTION

Among the several objects and features of the present invention may be noted the provision of a method of supplying source material in a crystal puller which inhibits exposure of the source material to the environment; the provision of such a method which inhibits the release of dust into the hopper; the provision of such a method which reduces the labor associated with supplying a crystal puller.

Further among the several objects and features of the present invention may be noted the provision of an apparatus for supplying source material in a crystal puller which delivers source material in bulk quantities to the crystal puller; the provision of such apparatus which inverts a bulk container carrying the source material; the provision of such an apparatus which is capable of transporting the bulk container of source material to the crystal puller; and the provision of such an apparatus which holds the bulk container at a height for dispensing the source material into the crystal puller.

Briefly, a method of this invention for supplying source material in a crystal puller used to grow single crystal semiconductor material generally comprises receiving a bulk container of said source material at a facility having the crystal puller and configuring the bulk container for gravity feed of the source material from the container. The bulk container is transported to the crystal puller and a predetermined quantity of source material is dispensed directly from the bulk container into the crystal puller.

In another aspect of the invention, an apparatus for supplying source material in the crystal puller generally includes means for inverting a bulk container of said source material, and means for transporting the inverted bulk container to the crystal puller. The apparatus further generally comprises means for lifting the bulk container to a predetermined height and means for connecting the bulk container to the crystal puller.

In yet another aspect of the present invention, a system for supplying source material in the crystal puller generally comprises a container transfer device having arms for grasping a bulk container of the source material. The transfer device is capable of moving the container from a first position to a second position. A cart has arms adapted for receiving the bulk container in the second position from the transfer device and holding the container independently of the container transfer device. The cart has a drive for driving the cart with the container to the crystal puller. The cart is adapted to hold the bulk container at a height for gravity flow of source material into the crystal puller.

Other objects and features of the present invention will be in part apparent and in part pointed out hereinafter.

BRIEF DESCRIPTION OF THE DRAWINGS

FIG. 5 is a side elevation of the valve cradle;

FIG. 6 is a section view of the valve cradle taken along line 6—6 in FIG. 5 showing the alternate positions of studs of the cradle;

FIG. 11 is a fragmentary right e nd elevation seen from the vantage indicated by line 11—11 in FIG. 4 but with the cart removed to show photoelectric eyes and an outlet of the transfer device;

FIG. 12 is an enlarged fragmentary top plan view of the eyes and outlet;

FIG. 13 is a fragmentary side elevation of a guide of a second embodiment;

FIG. 14 is a fragmentary section showing engagement of the cart with the guide.

Corresponding reference characters indicate corresponding parts throughout the several views of the drawings.

DETAILED DESCRIPTION OF THE PREFERRED EMBODIMENT

Figure 8:
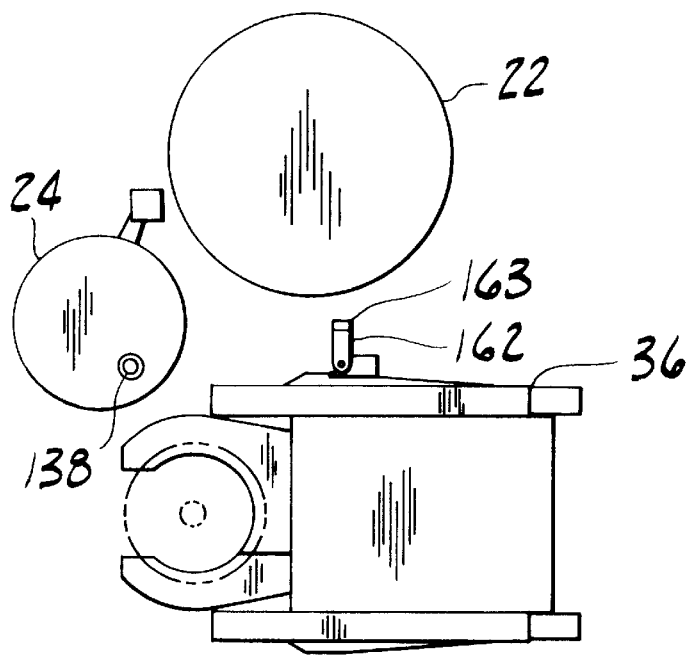
FIG. 8 is a schematic plan view of the cart docked at a crystal puller.

Referring now to the drawings, a system of the present invention is generally indicated at 20. The system is used in supplying source material to a crystal puller 22 schematically illustrated in FIG. 8. The system 20 and the crystal puller 22 are located within a clean room of a facility for growing crystals. The crystal puller 22 is preferably one which uses the Czochralski method for producing semiconductor material, such as Model No. CZ150 available from Ferrofluidics, Nashua, N.H. The crystal puller 22 includes a hopper 24 which delivers source material from the hopper to a crucible (not shown) within the crystal puller. The hopper 24 is of known construction, and is movable to a position for filling and refilling as will be described hereinafter.

A bulk container, for example in the form of a drum 28, is received from outside the facility and contains a substantial quantity of semiconductor source material. The source material in the drum 28 is preferably pelletized polysilicon (also referred to in the industry as "Lite Poly"). When filled with pelletized polysilicon, the drum 28 weighs at least about 100 kilograms, and is typically about 275 kilograms (600 pounds).

Referring again to FIG. 1, the system 20 of the invention comprises a container transfer device, generally indicated at 32, and a cart generally indicated at 36. The transfer device 32 has arms 40 for grasping the drum 28 by closing around the drum with sufficient pressure to support the weight of the drum. The arms 40 are mounted for pivoting from an open position for receiving the drum 28 to a closed position in which portions of the arms are in engagement with sides of the drum for holding the drum. The transfer device 32 includes a mechanism which is constructed to pivot the arms 40 from the open position to the closed position and back to the open position as required. Preferably, a 90V DC motor (not shown) is connected to the arms 40 by a gear mechanism (not shown) for pivoting the arms. Two sets of arms 40 are provided to ensure that the drum 28 is positively grasped, but without exerting too large a pressure on the container. (The inside of the container is lined with Teflon® or a similar coating which can be cracked if too much pressure is exerted on the container.) Preferably, frictionalizing pads 42 are mounted on the arms 40 for engaging the sides of the drum 28, and V-shaped frictionalizing pads 44 (see FIG. 2) are mounted on the transfer device 32 between the arms for engaging the sides of the drum. Sensors (not shown) are preferably included on or adjacent the arms 40 and the V-shaped pads 44 for sensing when the drum 28 is contacted by the arms and for controlling the amount of pressure exerted on the drum by the arms 40 such that the drum is positively grasped without damage to the drum. For instance, in this embodiment, once the sensors signal that the drum 28 is contacted, the motor is controlled to rotate a certain number of revolutions, e.g. three revolutions.

The transfer device 32 comprises a first turntable 48 mounted for rotation about a generally vertical axis to transfer the drum 28 from a conveyor 52 to the cart 36. The first turntable 48 is attached to a stand 54 which is affixed to the floor 56. The arms 40 are mounted on a second turntable 60 which is fixedly attached to the first turntable 48. The second turntable 60 is mounted for rotation about a generally horizontal axis to invert the drum 28. The 90V DC motor and gear mechanism are mounted in the second turntable 60 for rotation with the second turntable. The drum is inverted after the first turntable 48 has transferred the drum 28 partway to the cart 36 so that the drum will not contact either the conveyor 52 or the cart as it is rotated. The turntables 48, 60 are preferably actuated by gear mechanisms driven by 120V AC motors 62, 64, (see FIG. 2 showing the motor 62 of the first turntable 48).

Figure 2:
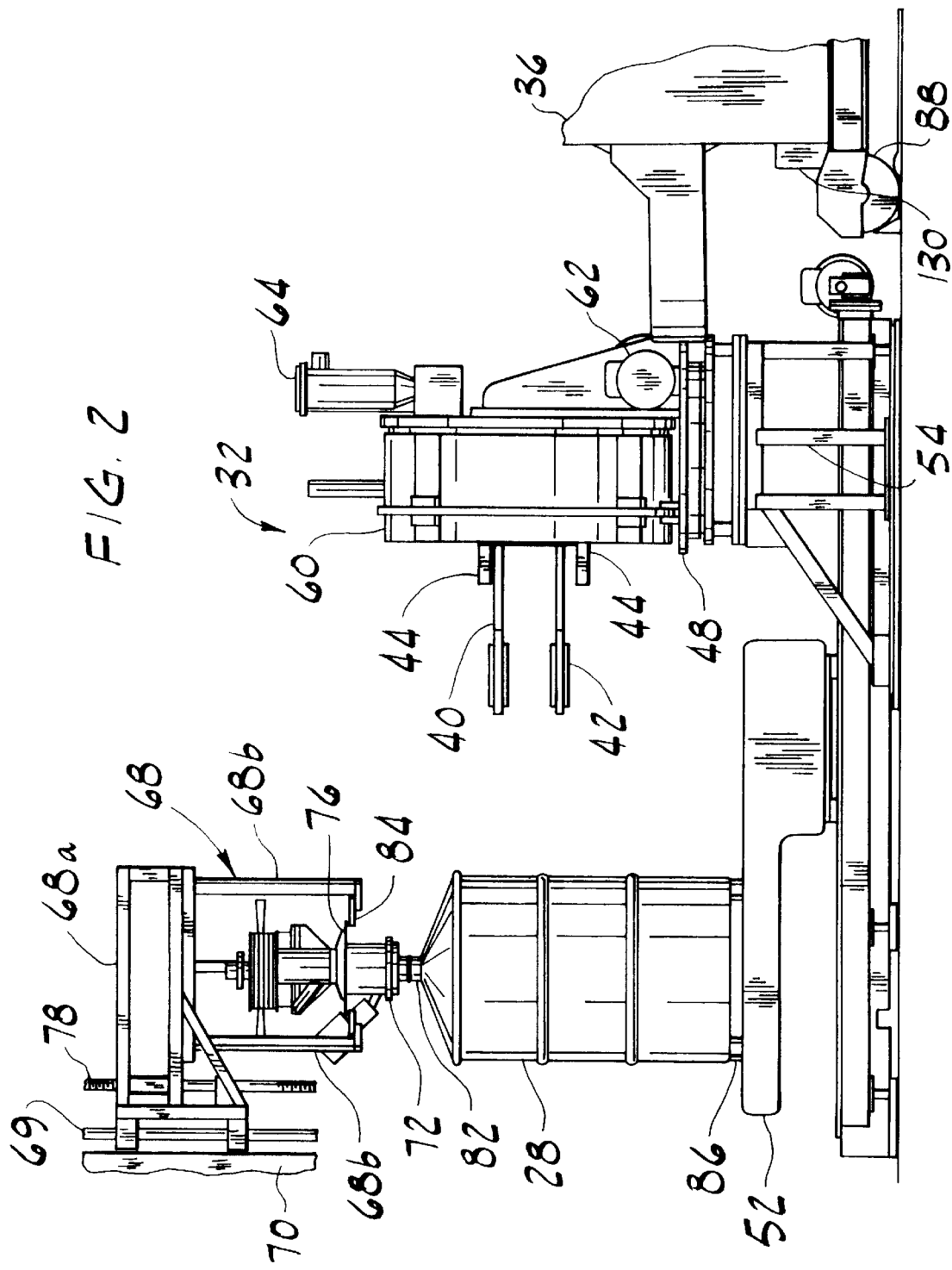
FIG. 2 is a fragmentary side elevation of the apparatus further illustrating a valve cradle.

Referring to FIGS. 2 and 5–6, a valve cradle, generally indicated at 68, is affixed to the wall 70 or other structure above the conveyor 52 for supporting a valve 72 and for raising and lowering the valve for installation and removal from drums 28. The valve cradle 68 includes an upper bracket 68a and three legs 68b depending from the bracket. The upper bracket 68a is slidingly connected to guide rails 69 (only one is shown) for guiding the vertical motion of the valve cradle 68. The valve 72 is supported on the valve cradle 68 by three upwardly projecting studs 74 located at the lower ends of the legs 68b. The studs 74 are received in three holes in a flange 76 (see FIG. 7) of the valve. The upper bracket 68a of the valve cradle 68 is threadably connected to a ball screw 78 for moving the valve cradle and the valve 72 from a stowed position in which the drum 28 can pass underneath the valve and valve cradle, downward to a deployed position in which the valve is close to or in engagement with an inlet 82 of the drum. As shown in FIGS. 5–6, the studs 74 are mounted on members 84 attached to the lower ends of the legs 68b to swivel (approximately 90°) horizontally about their attach points with the legs. The members 84 move out to provide clearance around the valve 72 after the valve is connected to the drum 28, permitting the empty cradle 68 to move upward to the stowed position. Preferably, the members 84 are swiveled automatically by actuation of a rotary actuator (not shown), such as Model No. PT014090-MRS available from Bimba Mfg. Co., Monet, Ill.

A conveyor 52 moves the drum 28 from just inside the door (not shown, positioned to the left of the apparatus as shown in FIG. 2) of the clean room. A shuttle (not shown) delivers the drum 28 to the conveyor 52. Vertically extendable supports 86 of the conveyor 52 are retracted when the drum 28 is not on the conveyor, and are raised to pick up the drum. As shown in FIG. 2, the conveyor 52 first moves the drum 28 to a position under the valve cradle 68. The conveyor 52 then moves the drum 28 to a position within the grasp of the arms 40 of the transfer device 32. The supports 86 of the conveyor 52 are retracted after the drum 28 is grasped by the arms 40 of the transfer device 32. The construction of a conveyor 52 capable of moving the drum 28 is well known in the art and will not be further described. It is contemplated that apparatus other than a conveyor may be used to transfer the drum 28 to the valve cradle 68 and to the transfer device 32, including delivery by a forklift (not shown) or by hand.

Figure 1:
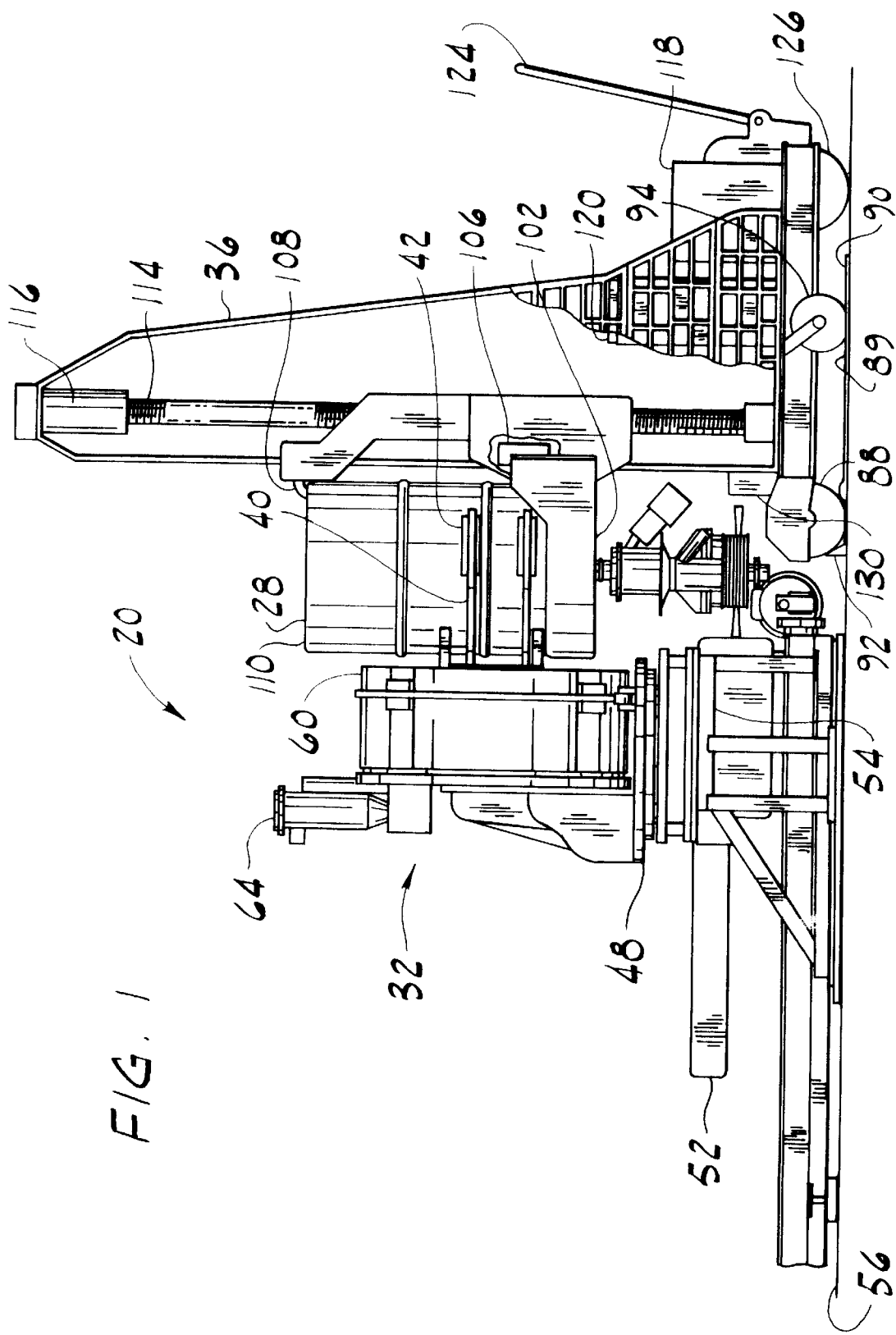
FIG. 1 is a side elevation of an apparatus for supplying source material of this invention showing a cart and a container transfer device with portions of the cart broken away to reveal internal construction.

Referring to FIG. 1, in a first embodiment, the transfer device 32 includes a guide 89 engageable with front wheels 88 and guide wheels 94 of the cart 36 for positioning the cart with respect to the transfer device. Preferably, the guide 89 includes two tracks 90 positioned on the floor such that when the front wheels 88 and guide wheels 94 are steered between the tracks, the cart 36 is guided to the proper position with respect to the transfer device 32. The guide 89 further includes a stop 92 for stopping the cart 36 at the proper position. The stop includes a channel between two upwardly sloped surfaces, one of the surfaces having an oppositely sloped surface so that the front wheels 88 of the cart 36 roll up the oppositely sloped surfaces and then roll down into the channel so that the front wheels are captured in the channel. At least one sensor (not shown) is provided to sense that the cart 36 is properly positioned with respect to the transfer device 32 for receiving or delivering the drum 28.

The transfer device 32 and the cart 36 can communicate for controlling operation of the cart during transfer of the drum 28 to the cart. As shown in FIGS. 11 and 12, four photoelectric eyes 96 are included adjacent the transfer device 32, and the cart 36 includes four corresponding eyes 96 positioned so that when the cart is engaged in the stops 92 of the guide 89, the photoelectric eyes of the transfer device and the cart are in registration. An outlet 98 receives a plug of the cart 36 for providing power to the cart. Preferably, the transfer device 32 includes a control panel 100 for controlling the inversion of the drum 28 and the transfer of the drum between the device and the cart 36.

Figure 4:
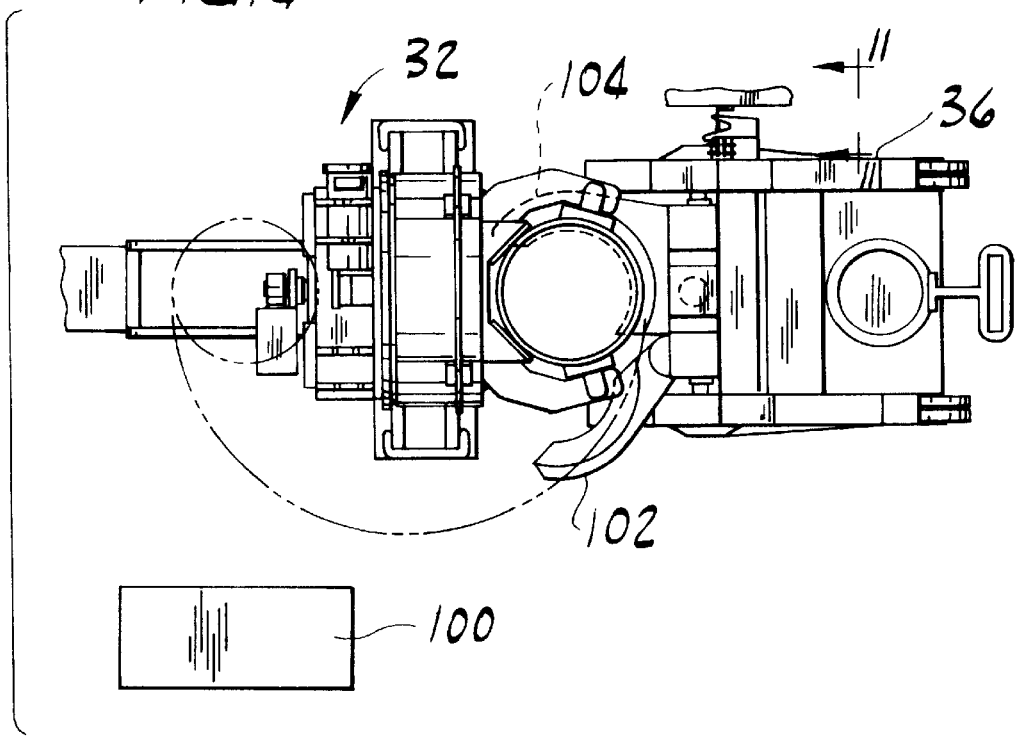
FIG. 4 is a schematic plan view of the apparatus of FIG. 1.

Referring to FIGS. 1 and 4, the cart 36 has a frame (which is partially broken away in FIG. 1) and arms 102, 104 for receiving the drum 28 and holding the drum independently of the transfer device 32. Preferably, at least one of the arms 102, 104 of the cart 36 is mounted to be pivoted outwardly so that the drum 28 can be received between the arms and for pivoting inwardly to a closed position. In the illustrated embodiment, the arm 102 is mounted on a vertical pin and is pivoted by a linear actuator having a 24V DC motor 106. The arm 102 pivots inwardly to a closed position, and both arms 102, 104 are mounted (as described below) to move upward from their position in FIG. 2 to the position in FIG. 1 to support the drum 28. Referring to FIG. 1, the cart 36 includes a latch 108 for engaging a rim 110 of the inverted drum 28, to further secure the drum to the cart. The latch 108 is movable between a position wherein the latch does not interfere with the drum 28, as it is positioned over the arms 102, 104 of the cart 36, to an engaged position in which the latch pivots toward the drum and moves downward until the latch contacts the rim 110. Preferably, sensors are provided on the arms 102, 104 and/or adjacent the latch 108 to sense when the drum is securely held on the cart 36.

The arms 102, 104 of the cart 36 and the latch 108 are mounted for vertical translation. The arms 102, 104 and latch 108 are mounted on a ball screw 114 of the cart 36 which extends from a base of the cart to a bearing 116 adjacent the top of the cart. The arms 102, 104 and latch 108 are moved by rotation of the ball screw 114 for mounting/demounting the drum 28 on the cart 36 and are moved with the drum to a predetermined height for gravity flow of the source material into the crystal puller 22. Preferably, the ball screw 114 is rotated by a 120V AC motor (not shown) mounted on the cart.

The cart 36 has a drive motor 118 for driving the cart and drum 28 to the crystal puller 22. The motor 118 is connected by a gear mechanism to a drive wheel 126. A suitable motor is a 12V DC motor available from Prestolite Electric Inc., Ann Arbor, Mich., Model No. MKS-4002. Power to the motor 118 is preferably provided by a rechargeable 12V gel cell battery 120. Preferably, the battery 120 only provides power to the motor 118. Power for the other motors of the cart 36 is provided through outlets 98 at the transfer device 32 and the crystal puller 22 (only the outlet at the transfer device 32 is shown). The cart 36 includes a steering bar 124, similar to a steering bar for a forklift, for operation of the cart by an operator. The drive wheel 126 is manually turned by the steering bar 124 to steer the cart to the crystal puller 22. The two front wheels 88 are steered by a mechanism including 120V AC motors 130 (only one of which is shown). The front wheels 88 are preferably only steered at the crystal puller 22 as described below, but are not steered as the cart 36 is transported from the transfer device 32 to the puller. Preferably, the components of the cart 36, including the motors, battery, wheels, etc. are designed such that they can operate in a Class 10,000 clean room without detrimental effect to the clean room environment.

Figure 7:
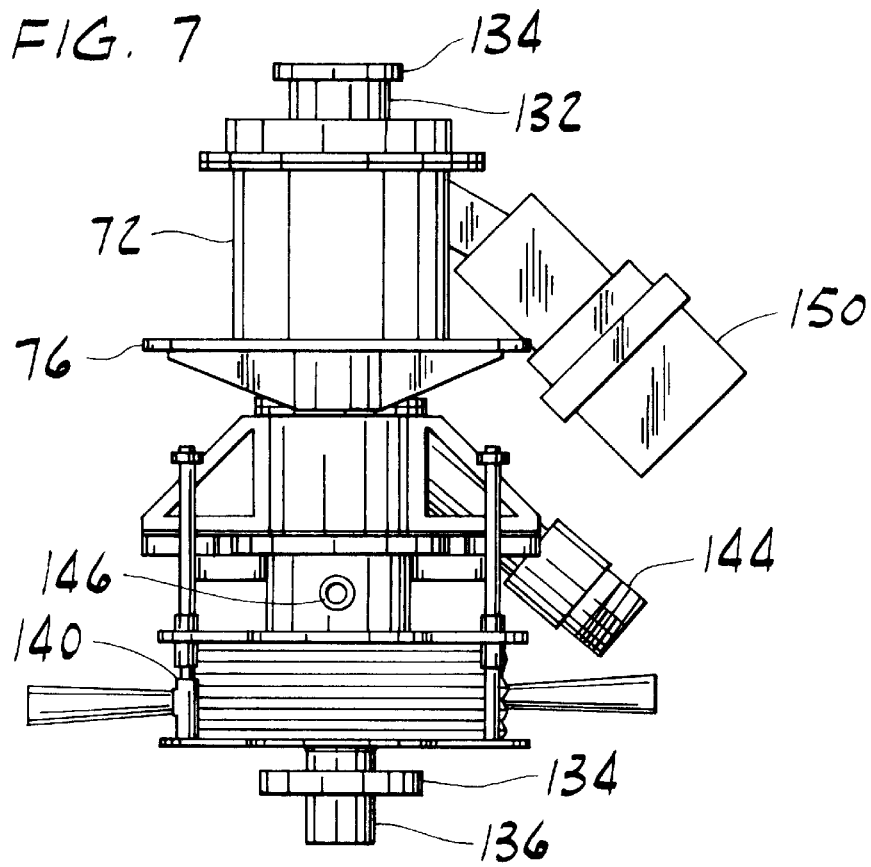
FIG. 7 is a side elevation of a valve.
Figure 10:
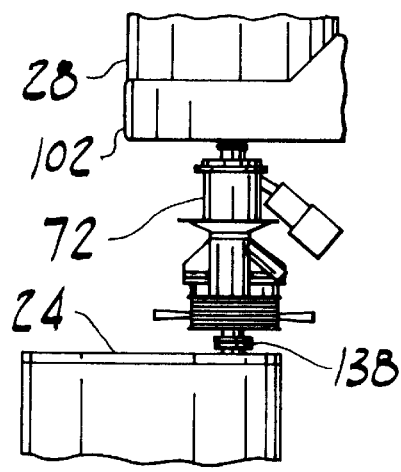
FIG. 10 is a fragmentary side elevation showing the container and valve connected to a hopper of the crystal puller.

Referring to FIGS. 7 and 10, the valve 72 is constructed at a first end 132 to mate with an inlet 82 of the drum 28 and at a second end 136 to mate with an inlet 138 of the hopper 24 of the crystal puller 22. Both ends 132, 136 are demountably attached to the respective inlets by clamps 134, such as by HPS clamps made by MKS Instruments, Andover, Mass. The second end 136 of the valve 72 preferably has a bellows portion 140 so that the second end can be moved downwardly and/or laterally, as necessary, for mating with the inlet 138 of the hopper 24. The bellows portion includes locking pins which can be loosened to allow the bellows to be moved downwardly and/or laterally. The valve 72 has a central passage extending through the valve for allowing the source material to flow through the valve, and a shutoff to prevent the flow of source material. The valve 72 is preferably an "Angle of Repose" (AOR) valve, such as Model No. AORS-26 available from Associated Technology Manufacturers. Preferably, the valve 72 includes a vacuum line inlet 144 extending outwardly from a middle portion of the valve for connection of a vacuum line (not shown). The valve 72 further includes a quick disconnect fitting 146 positioned near the bellows portion 140 for connection of an inert gas line (not shown). The inlet 144 and fitting 146 are in communication with the central passage for evacuating the valve 72 and for removing dust from the valve. Preferably, the valve 72 includes an electronic control 150 for controlling the flow of source material through the valve which is connected by a cable to the cart 36, or alternatively, the crystal puller 22, for remote control of the flow. The electronic control 150 has a manual switch so that an operator can manually control the flow of source material.

In a second embodiment, the transfer device 32 includes a guide 154 which can be engaged by the cart 36 for positioning the cart with respect to the transfer device. Referring to FIGS. 12 and 13, the guide 154 is attached to a stanchion 155 or the wall and includes a short vertical post 156 which is received between two fingers 158 attached to the cart 36 when the cart is engaged with the guide. Preferably, two guides 154 are included on the stanchion 155, and two sets of two fingers 158 are included on the cart 36. The fingers 158 may also include locking pins (not shown) which can be slipped through holes in the fingers of the cart 36 to lock the cart in engagement with the guide.

It is envisioned that the function of inverting the drum 28, which is performed in this embodiment by the transfer device 32, could also be accomplished by the cart 36. Thus, the cart 36 may be modified to enable it to invert the drum 28. For instance, the arms 102, 104 of the cart 36 could be replaced by a set of arms made to grasp the drum 28 like the arms 40 of the transfer device 32. The arms would be mounted on a turntable like that of the first turntable 48 of the transfer device. Other structural modifications necessary to strengthen the cart 36 for supporting the weight of the drum 28 during inversion will be apparent to those skilled in the art.

A method of supplying source material to the crystal puller 22 will now be described. The method comprises the step of receiving the drum 28 of source material at the facility having the crystal puller 22. The drum 28 is delivered from a location remote from the facility and is received at the facility at a dock outside the clean room. Of course, it is within the scope of the present invention to have the source material produced at the same facility at a location separate from the crystal puller 22. The drum 28 is transferred, such as by the shuttle described above, to an air lock between the dock area and the clean room. Preferably, the drum 28 is cleaned while in the air lock, such as by wiping it down with rubbing alcohol or other suitable cleaning solution. The conveyor 52 is then moved into the air lock and positioned under the drum 28 while it is still supported by the shuttle. The extendable supports 86 of the conveyor 52 are then raised, lifting the drum 28 off of the shuttle. The conveyor 52 is moved out of the air lock and the air lock is closed.

The method further comprises the step of configuring the drum 28 for gravity feed of the source material from the drum. The conveyor transfers the drum 28 to a position under the valve cradle 68. Preferably, an inert gas line is connected to the fitting 146 for purging the air from the valve 72 so that exposure of the source material to the environment is inhibited. A lid covering the inlet 82 in the drum 28 is removed, and the valve cradle 68 is lowered by operation of the ball screw 78 until the valve 72 is near to or is in contact with the drum, and the clamp 134 is used to secure the valve to the drum. The valve cradle 68 is further lowered so that the studs 74 are disengaged from the holes in the flange 76, and the members 84 are swung out of the way as described above. The valve cradle 68 is then moved upward to its stowed position. An operator inputs to the control panel 100 that the valve 72 is attached to the drum 28, and the drum is then automatically inverted and transferred to the cart 36 according to the steps described hereinafter.

Figure 3:
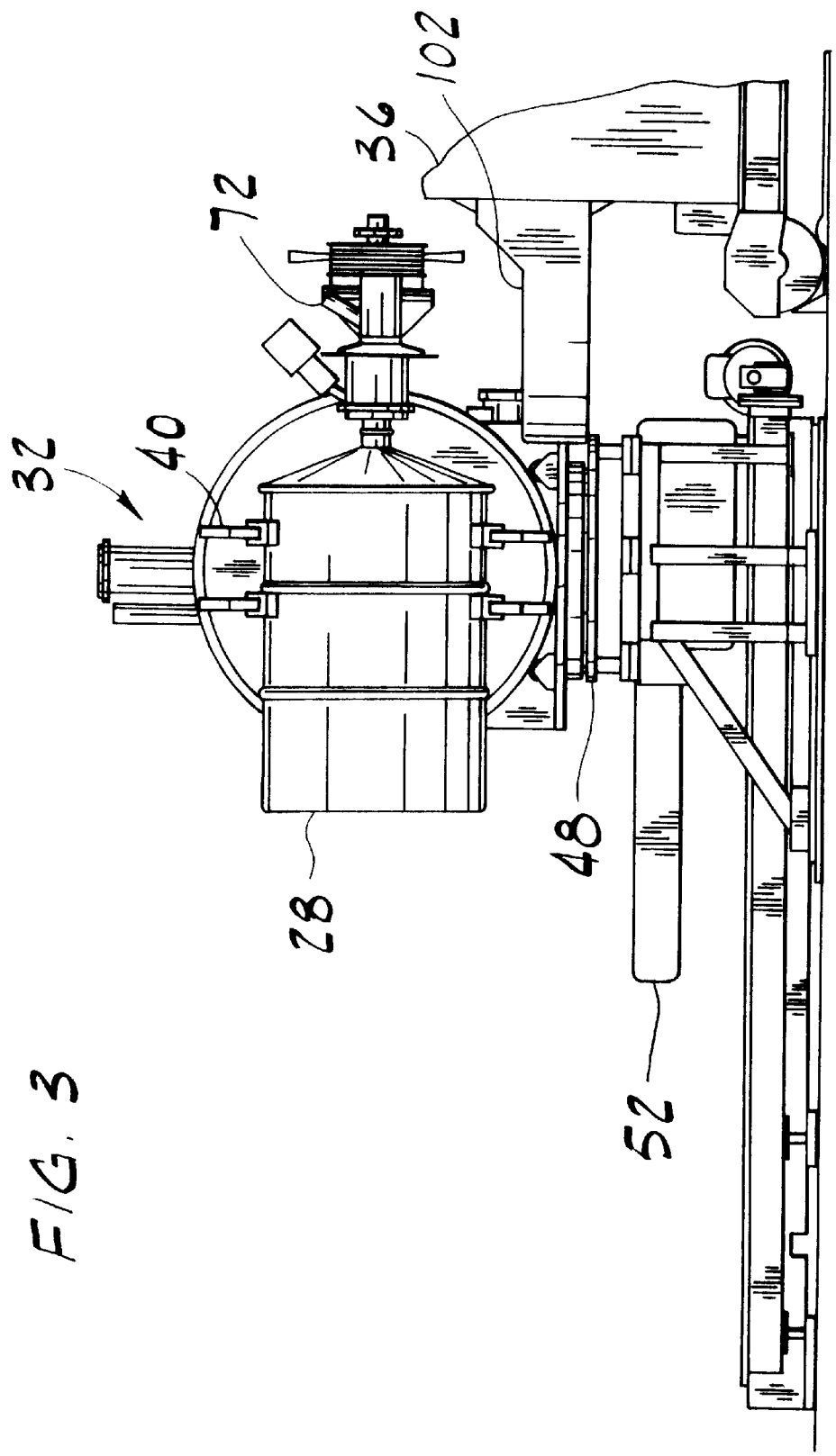
FIG. 3 is a fragmentary side elevation showing the transfer device of the invention during inversion of a bulk container of the source material.

The step of configuring the drum 28 further comprises inverting the drum. The drum 28 is moved to the transfer device 32 by the conveyor 52, and is grasped by the arms 40 of the transfer device. Sensors of the transfer device 32 communicate to the control panel 100 that the drum has been contacted and the motor is controlled as described above to ensure that the container is grasped. The extendable supports 86 of the conveyor 52 are retracted so that the arms 40 support the weight of the drum 28. The transfer device 32 rotates the drum 28 through a 90° arc about the vertical axis of the first turntable 48 of the transfer device and stops. The transfer device 32 then rotates the drum 180° (the 90° position is shown in FIG. 3) about the horizontal axis of the second turntable 60. Preferably, the horizontal axis intersects a point near the center of gravity of the drum 28. The transfer device 32 then rotates the inverted drum 90° about the vertical axis of the first turntable 48 in the same direction of movement as before, so that the drum 28 is received between the arms 102, 104 of the cart 36. The pivotable arm 102 of the cart 36 is pivoted outward while the drum 28 is rotated to provide space for the drum 28 to move between the arms.

The method further comprises transporting the inverted drum 28 to the crystal puller 22. The drum 28 is held on the cart 36 by rotating the pivotable arm 102 of the cart inward to its closed position and by raising the arms of the cart upward by use of the ball screw 114 of the cart 36 until the drum rests on the arms. The latch 108 of the cart 36 is moved into engagement with the rim 110 of the inverted drum 28, its engagement position being shown in FIG. 1. The arms 40 of the transfer device 32 are opened, thus transferring the weight of the drum 28 to the cart 36. The sensors on the cart 36 communicate to the transfer device 32 and the control panel 100 that the drum is securely held by the cart. The cart 36 with the drum 28 is then driven away from the transfer device 32 and to the crystal puller 22. The cart 36 is positioned at the crystal puller 22 by bringing the cart into engagement with guides 162 (shown schematically in FIGS. 8 and 9) mounted on a stanchion 163 similar to the guides 154 associated with the transfer device 32 in the second embodiment described above. The cart 36 is preferably locked to the guides 162 by pins (not shown). The outlet 98 at the crystal puller 22 receives the plug of the cart 36 for providing power to the cart 36 and for communicating to a controller of the crystal puller 22 that the cart is docked at the puller.

Figure 9:
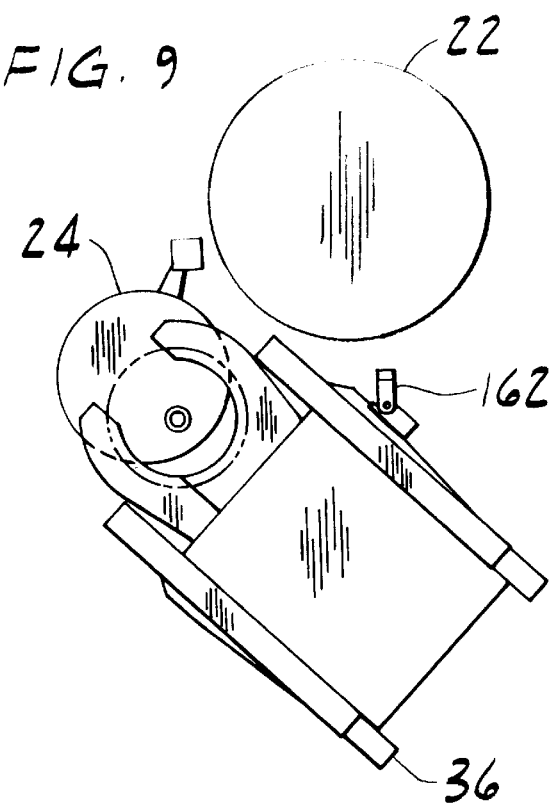
FIG. 9 is a schematic plan view like FIG. 8 showing the container in position for dispensing source material into the puller.

The method further comprises the step of dispensing a predetermined quantity of source material directly from the drum 28 to the hopper 24 of the crystal puller 22. An inert gas line and vacuum line at the crystal puller 22 are connected to the valve 72 for preventing dust from entering the hopper, for preventing the dust from collecting inside the valve and fouling the valve mechanism, and to inhibit exposure of the source material to the environment. The drum 28 is lifted by the cart 36 to the predetermined height which is above the height of the hopper 24. The front wheels 88 of the cart 36 are turned inward toward the crystal puller 22 by operation of motors 130, and the cart, still connected to the guides 162, is driven on an arc centered on the guides. The hopper 24 is moved by a mechanism of the crystal puller 22 to a position in which the second end 136 of the valve 72 is positioned roughly over the inlet 138 of the hopper 24, as shown in FIG. 9. The drum 28 is lowered until the second end 136 of the valve 72 is in contact or is nearly in contact with the inlet 138. As shown in FIG. 10, the valve 72 is mated with the hopper inlet 138 (by pulling the locking pins of the bellows portion 140, moving the second end 136 laterally and/or vertically and clamping the valve to the hopper 24) and the valve is opened to allow the source material to flow into the hopper 24. During dispensing, inert gas flows through the valve 72 to purge air from the valve and the vacuum line aids in pulling any dust produced by the source material as it passes through the valve. The valve 72 is closed after a desired amount is dispensed, and the method is reversed to move the cart 36 away from the crystal puller 22. The cart 36 and drum 28 may be transported to other crystal pullers for dispensing more source material until the supply in the drum is exhausted. The drum 28 is removed from the clean room by transporting the cart 36 back to the transfer device 32 and reversing the method described above, i.e., the drum is transferred from the cart to the transfer device to the conveyor. The valve 72 is removed at the valve cradle 68, and the empty drum 28 is transferred from the conveyor 52 to the shuttle for transfer to the dock.

It is to be understood that further automation of the method is within the scope of this invention. Most preferably, little or no manual intervention in the method would be required. For instance, the steps of attaching the valve 72 to the drum 28 and attaching the drum to the hopper 24 may also be fully automated within the scope of this invention. Also, safety features such as light curtains and safety mats (not shown) communicate with the control panel 100 so that motion of the system 20 is stopped if a person is too close to the system.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A method of replenishing source material in a hopper of a crystal puller located in a clean room of a facility and used to grow single crystal semiconductor material, the method comprising the steps of:

receiving a bulk container of said source material which has been pre-filled with said source material and closed outside the clean room, the bulk container being received from outside the clean room;

configuring the bulk container for gravity feed of the source material from the container;

transporting the bulk container to the crystal puller;

dispensing a predetermined quantity of source material directly from the bulk container into the hopper of the crystal puller;

transporting the bulk container away from the crystal puller, the method using only the bulk container to replenish the hopper and being free of any intermediate container to transport the source material.

2. A method of replenishing source material as set forth in claim 1 wherein said steps of transporting and dispensing are carried out without opening the container to ambient air in the facility.

3. A method of replenishing source material as set forth in claim 1 wherein the step of configuring the bulk container for gravity feed comprises attaching a valve to the bulk container.

4. A method of replenishing source material as set forth in claim 3 wherein the step of configuring the bulk container for gravity feed includes purging air from the valve.

5. A method of replenishing source material as set forth in claim 4 wherein the step of dispensing a predetermined quantity of source material includes attaching the valve to the hopper of the crystal puller.

6. A method of replenishing source material as set forth in claim 1 wherein the step of configuring the bulk container for gravity feed comprises inverting the container.

7. A method of replenishing source material as set forth in claim 1 wherein the bulk container is received from a location remote from the facility.

8. A method of replenishing source material as set forth in claim 1 wherein the bulk container weighs about 275 kilograms.

9. A method of replenishing source material as set forth in claim 1 wherein the step of transporting the bulk container comprises mounting the container on a powered cart.

10. A method of supplying source material as set forth in claim 1 wherein there are plural crystal pullers in the clean room and wherein the method further comprises, in addition to said steps of transporting the bulk container and dispensing a predetermined quantity of source material, the steps of again transporting the bulk container to one of the crystal pullers and again dispensing a predetermined amount of source material directly from the bulk container into the crystal puller.

11. A method of supplying source material to a crystal puller located in a clean room of a facility and used to grow single crystal semiconductor material, the method comprising the steps of:

receiving a bulk container of said source material which has been pre-filled with said source material and closed outside the clean room, the bulk container being received from outside the clean room;

configuring the bulk container for gravity feed of the source material from the container;

transporting the bulk container to the crystal puller;

dispensing a predetermined quantity of source material directly from the bulk container into the crystal puller;

transporting the bulk container away from the crystal puller, the method using only the bulk container to supply the hopper and being free of any intermediate container to transport the source material.

12. A method of supplying source material as set forth in claim 11 wherein said steps of transporting and dispensing are carried out without opening the container to ambient air in the facility.

13. A method of supplying source material as set forth in claim 11 wherein the step of configuring the bulk container for gravity feed comprises attaching a valve to the bulk container.

14. A method of supplying source material as set forth in claim 11 wherein the step of dispensing a predetermined quantity of source material includes attaching the valve to the crystal puller.

15. A method of supplying source material as set forth in claim 11 wherein the step of configuring the bulk container for gravity feed comprises inverting the container.

16. A method of supplying source material as set forth in claim 11 wherein the bulk container weighs about 275 kilograms.

17. A method of supplying source material as set forth in claim 11 wherein the step of transporting the bulk container comprises mounting the container on a powered cart.

18. A method of supplying source material as set forth in claim 11 wherein there are plural crystal pullers in the clean room and wherein the method further comprises, in addition to said steps of transporting the bulk container and dispensing a predetermined quantity of source material, the steps of again transporting the bulk container to one of the crystal pullers and again dispensing a predetermined amount of source material directly from-the bulk container into the crystal puller.

19. A method of supplying source material to a crystal puller located in a clean room of a facility and used to grow single crystal semiconductor material, the method comprising the steps of:

receiving a bulk container of said source material which has been pre-filled with said source material and closed outside the clean room, the bulk container being received from outside the clean room;

configuring the bulk container for gravity feed of the source material from the container by moving the bulk container to a transfer device having arms for grasping the bulk container and operable to invert the bulk container, inverting the bulk container, and moving the bulk container to a cart having arms adapted for receiving the bulk container;

securing the bulk container on the cart;

transporting the bulk container on the cart to the crystal puller;

dispensing a predetermined quantity of source material directly from the bulk container into the crystal puller;

transporting the bulk container away from the crystal puller, the method using only the bulk container to supply the hopper and being free of any intermediate container to transport the source material.

20. A method of supplying source material as set forth in claim 19 wherein said steps of transporting and dispensing are carried out without opening the container to ambient air in the facility.

21. A method of supplying source material as set forth in claim 19 wherein the step of configuring the bulk container for gravity feed further comprises attaching a valve to the bulk container.

22. A method of supplying source material as set forth in claim 21 wherein the step of dispensing a predetermined quantity of source material includes attaching the valve to the crystal puller.

23. A method of supplying source material as set forth in claim 19 wherein there are plural crystal pullers in the clean room and wherein the method further comprises, in addition to said steps of transporting the bulk container and dispensing a predetermined quantity of source material, the steps of again transporting the bulk container to one of the crystal pullers and again dispensing a predetermined amount of source material directly from the bulk container into the crystal puller.

* * * * *

UNITED STATES PATENT AND TRADEMARK OFFICE
CERTIFICATE OF CORRECTION

PATENT NO. : 6,089,285

DATED : July 18, 2000

INVENTOR(S) : Mark DeStefano, James Eoff, Sr., Thomas Schulte, John Anderson, Donald Ruggeri, David Baldwin, Charles Badino It is certified that error appears in the above-identified patent and that said Letters Patent is hereby corrected as shown below:

In column 9, claim 10, line 33 "of supplying source" should read -- of replenishing source --.

In column 9, claim 14, line 67 "claim 11" should read -- claim 13 --.

In column 10, claim 18, line 19 "from-the" should read -- from the --.

Signed and Sealed this

Seventeenth Day of April, 2001

Attest:

NICHOLAS P. GODICI

*Attesting Officer*   *Acting Director of the United States Patent and Trademark Office*